United States Patent [19]

Cohen

[11] 3,883,825

[45] May 13, 1975

[54] INTEGRATED CIRCUIT RELAXATION OSCILLATOR HAVING MINIMAL EXTERNAL PADS

[75] Inventor: Burton E. Cohen, Huntington Station, N.Y.

[73] Assignee: General Instrument Corporation, Clifton, N.J.

[22] Filed: Feb. 19, 1974

[21] Appl. No.: 443,235

[52] U.S. Cl. .............................. 331/111; 331/108 C

[51] Int. Cl. ............................................ H03b 5/24

[58] Field of Search ............ 331/108 C, 108 D, 111, 331/143

[56] References Cited

UNITED STATES PATENTS

| | | | |
|---|---|---|---|
| 2,979,626 | 4/1961 | Pinckaers | 331/111 |
| 3,659,224 | 4/1972 | Ball | 331/111 |

*Primary Examiner*—Siegfried H. Grimm

[57] ABSTRACT

A LSI oscillator circuit includes a load device and a drive device, the output circuits of which are connected in series between a voltage source and a reference potential. The circuit output node is connected between the output circuits of the load and driver devices. A control node is connected to the control terminal of the driver device. When the voltage at the control node is less than the threshold voltage of the driver device, the driver device is nonconductive and the output node is charged to a given voltage. When the voltage at the control node is above the threshold voltage of the driver device, the driver device is rendered conductive thereby causing the output node to discharge to the reference potential. The control node is connected to a voltage source through a resistor and connected to the reference potential through a capacitor. This arrangement permits the charging of the control node over a period of time from the reference potential through the threshold voltage of the driver device. The control node is discharged by means of a transistor, the output circuit of which is connected between the control node and the reference potential. The control terminal of the discharging transistor is connected to the control node through a plurality of series connected transistors such that the discharging transistor is rendered conductive to discharge the control node when the control node reaches a potential sufficient to render the series connector transistors and discharging transistor conductive. Thereafter, the discharging transistor is rendered nonconductive and the control node permitted to recharge.

24 Claims, 2 Drawing Figures

INTEGRATED CIRCUIT RELAXATION OSCILLATOR HAVING MINIMAL EXTERNAL PADS

The present invention relates to oscillator circuits and more particularly to a LSI oscillator circuit having minimal external pads.

Recently, circuit fabrication techniques have advanced to the state where it is now possible to integrate a plurality of transistors and other circuit devices on a single substrate or chip and to interconnect them in a way such that the resultant circuit will perform a desired function or multiplicity of functions. Obviously, it is desirable to fabricate a circuit such that the entire circuit or as much of the circuit as possible is contained on a single chip. The fabrication of a wholly contained circuit on a single chip eliminates the necessity of making provisions for interconnecting the chip with external circuit elements. Such interconnections normally require contact pads on the semiconductor chip to enable the external devices to be connected thereto. These pads not only take up valuable space on the chip, but also require additional interconnections between the pads and the appropriate portions of the circuit. Further, additional operations are necessary to connect the pads to the external components. Moreover, connections between the pads and the external components are never perfect and therefore cause a certain amount of power loss at the junction between the pad and the external component.

On the other hand, the elimination of external components by fabricating the components directly on the semiconductor chip may result in the reduction of the operational stability of the circuit. For instance, oscillator circuits have been fabricated on semiconductor chips which require as many as three contact pads to achieve the desired operational stability. These circuits, therefore, have all of the disadvantages inherently associated with multiple contact pads. However, until now it was not possible to reduce the number of connections with external components in such a circuit without substantially reducing the operational stability of the oscillator.

It is, therefore, a prime object of the present invention to provide an LSI oscillator circuit having a single external pad which demonstrates the operational stability achieved by circuits requiring multiple external pads.

It is another object of the present invention to provide an LSI oscillator circuit which is wholly contained on a single chip and therefore requires no external pads which can be utilized when operational stability is not of prime concern.

In accordance with the present invention an LSI oscillator circuit is provided having an output node, a control node, and first means operably connected to the output node and the control node. The first means is effective when the voltage at the control node is at a first value to charge the output node to a given voltage. When the voltage at the control node is at a second value, the first means charges the output node to a different voltage Charging means are operably connected to the control node and effective to charge the control node from the first value through the second value to a third value over a period of time. Second means are provided operably connected to the control node which are effective to return the control node to the first value when it reaches the third value and then to permit it to recharge to the third value.

In order to achieve operational stability comparable to oscillator circuits requiring multiple external pads, the charging means, which comprises a resistor and a capacitor, is provided through the use of external components which are connected to the circuit by means of a single external pad. However, if stability of operation is not of prime concern, the components of the charging means can be included on the chip thereby obtaining an oscillator circuit wholly contained on a single chip with no external pads.

To the accomplishment of the above, and to such other objects as may hereinafter appear, the present invention relates to an oscillator circuit having minimal external pads as defined in the appended claims and as described in the specification, taken together with the accompanying drawing in which:

Figure 1:
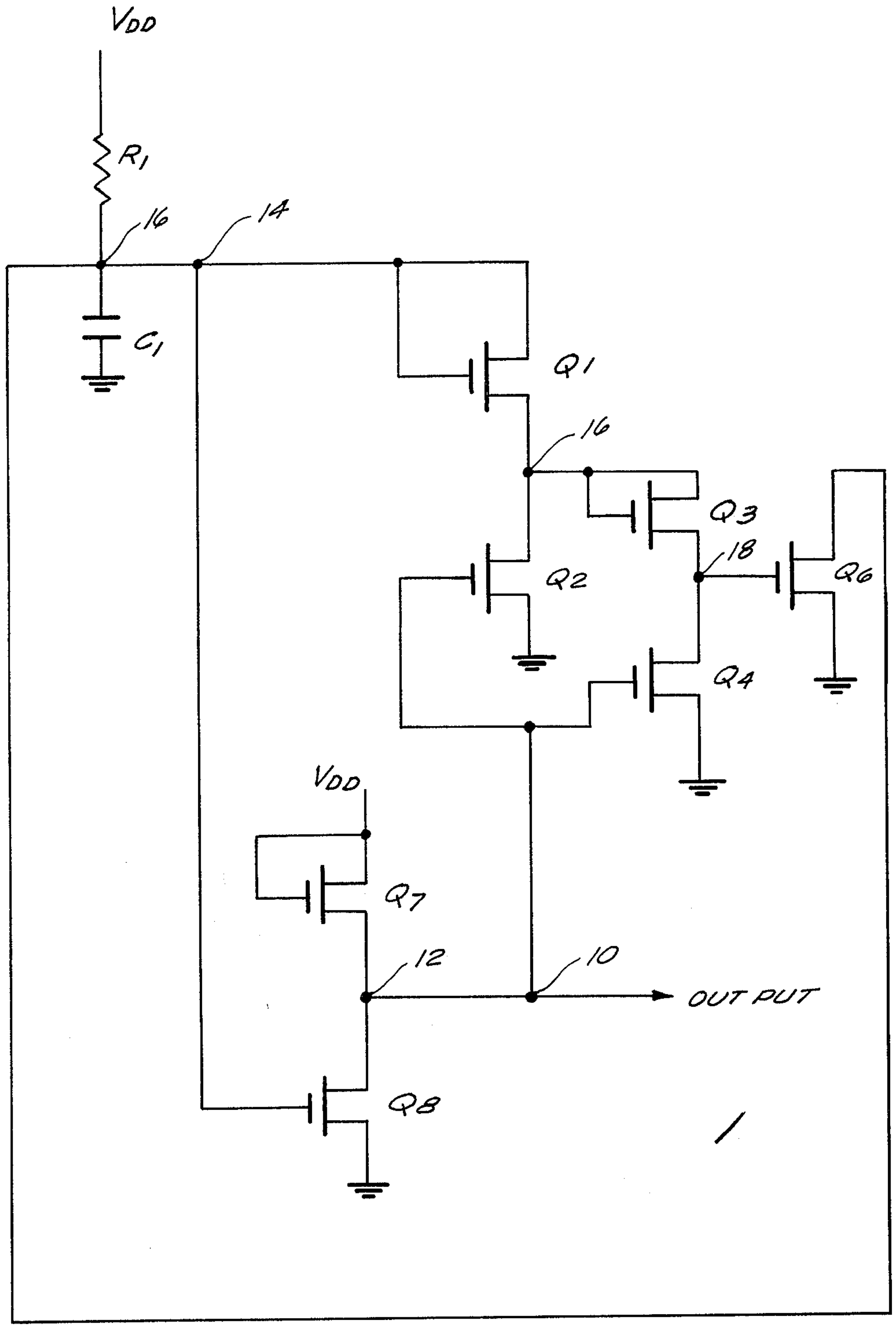
FIG. 1 is a schematic diagram of a preferred embodiment of the present invention.

As seen in FIG. 1, the oscillator circuit of the present invention has an output node 10 at which the oscillated output signal appears. Output node 10 is connected to node 12 situated at the junction of the output circuits of transistors $Q_7$ and $Q_8$, which form the first means. The first means is basically an inverter circuit having a load device in the form of transistor $Q_7$ and a driver device in the form of transistor $Q_8$ whose output circuits are connected in series between a voltage source $V_{DD}$ and a source at a voltage of a first value which is a reference potential, in this case ground. The control terminal of transistor $Q_7$ is tied to its output circuit in the manner conventional in the art for forming a load device and the control terminal of transistor $Q_8$ is connected to control node 14.

When control node 14 is at the first value (ground), transistor $Q_8$ is nonconductive. This permits node 12 to charge to a given voltage determined by the value of voltage source $V_{DD}$. However, when control node 14 is charged to a second value, greater than the threshold voltage of driver transistor $Q_8$, transistor $Q_8$ is rendered conductive, causing node 12 to discharge (or charge) to a different voltage, depending upon the voltage level of the source to which the output circuit of driver transistor $Q_8$ is tied, i.e., the reference potential, in this case ground. Since output node 10 is connected to node 12, the output signal will be the signal which appears at node 12 which will oscillate between the given voltage and the reference potential.

The function of the remainder of the circuit is to control the voltage level at control node 14. The charging means, which comprises an R-C circuit, is operably connected to control node 14. The charging means comprises a resistor $R_1$ connected between a voltage source $V_{DD}$ and node 16. Node 16 is also connected to one side of capacitor $C_1$, the other side of which is connected to a voltage source at the first (reference) value, in this case ground. The R-C circuit of the charging means serves to charge node 16 and therefore control node 14 connected thereto at a predetermined rate to a voltage level dependent upon the voltage of source $V_{DD}$. The time required to charge control node 14 to this voltage level is dependent upon the resistance of resistor $R_1$ and the capacitance of capacitor $C_1$. The charging means is at least effective to charge control node 14 from a first value (ground) through a second value (the threshold voltage of transistor $Q_8$) to a third value greater than the second value (the purpose of which is described below).

The second means comprises a transistor $Q_6$ having its output circuit connected between control node 14 and a voltage source of the first value, in this case ground. Transistor $Q_6$ is effective, when conductive, to return control node 14 to the first value (ground). The control terminal of transistor $Q_6$ is connected to control node 14 through transistors $Q_1$ and $Q_3$ whose output circuits are connected in series. The control terminal of each of the transistors $Q_1$ and $Q_3$ is tied to its respective output circuit, thus causing each transistor $Q_1$ and $Q_3$ to function as a load device. Transistor $Q_6$ will be rendered conductive when the voltage level of control node 14 minus the combined threshold voltages of transistors $Q_1$ and $Q_3$ exceeds the threshold voltage of transistor $Q_6$. The voltage level which must be obtained on control node 14 in order to render transistor $Q_6$ conductive is the third value referred to above. Therefore, when control node 14 charges to the third value, transistor $Q_6$ will be rendered conductive thereby connecting control node 14 to ground through the output circuit of transistor $Q_6$, discharging $C_1$ and returning control node 14 to the first value.

Additional transistor means in the form of transistors $Q_2$ and $Q_4$ are provided to render transistor $Q_6$ nonconductive after control node 14 has been returned to the first value (ground), thereby permitting the recharging of control node 14. Transistor $Q_2$ has its output circuit operably connected between node 16, which is the junction between the output circuits of transistors $Q_1$ and $Q_3$, and a source of the first value, in this case ground. Transistor $Q_4$ has its output circuit connected between node 18, which is the junction between the control terminal of transistor $Q_6$ and the output circuit of transistor $Q_3$ and a source of the first value, in this case ground. The control terminal of transistor $Q_2$ and the control terminal of transistor $Q_4$ are connected to output node 10. Transistors $Q_2$ and $Q_4$ are nonconductive as long as the output terminal 10 is at the first value. However, as soon as output node 10 is charged to the given voltage, which is greater than the threshold voltages of transistors $Q_2$ and $Q_4$ respectively, transistors $Q_2$ and $Q_4$ will be rendered conductive, thereby causing nodes 16 and 18 to go to ground and causing transistor $Q_6$ to become nonconductive.

Figure 2:
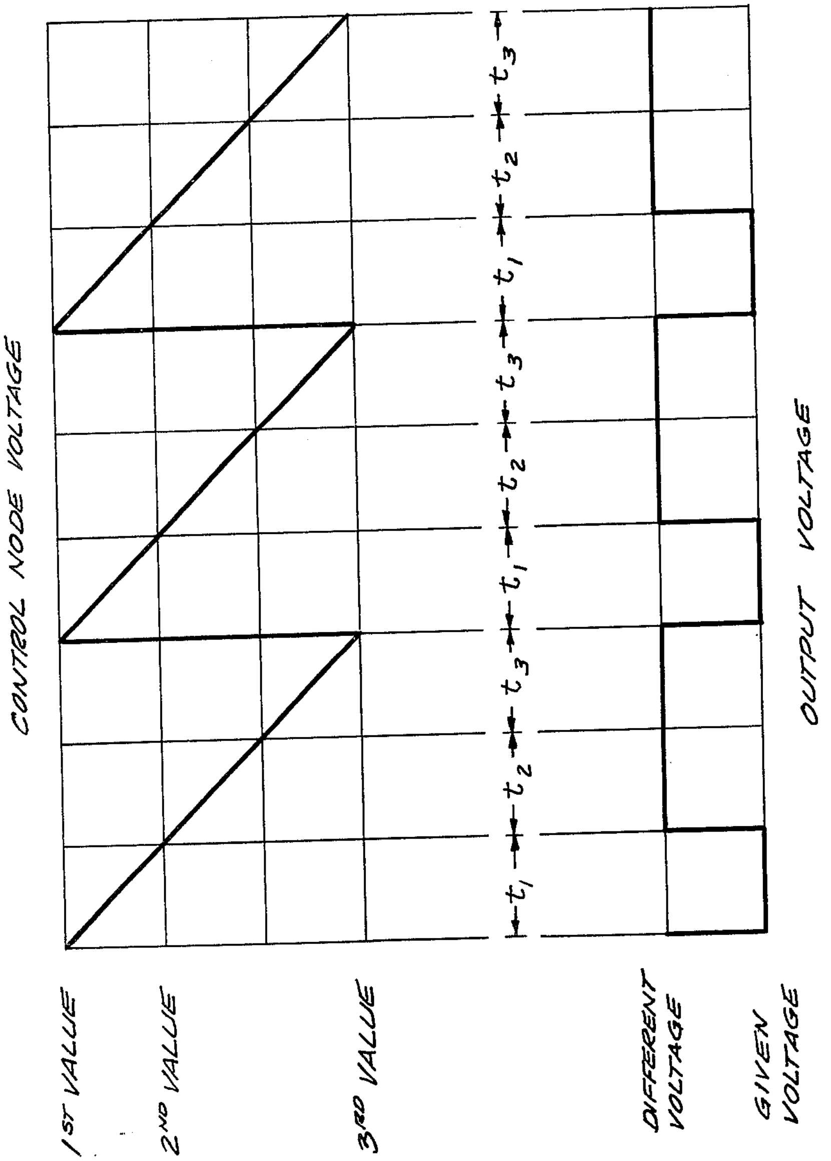
FIG. 2 is a graphical representation of the relationship between the voltage at the control node and the output voltage of the present invention.

FIG. 2 is a graphical representation of the relationship between the voltage level at control node 14 and the voltage level of output node 12. In this drawing voltage source $V_{DD}$ is assumed to be negative as are the threshold voltages of the transistors $Q_1$ through $Q_8$. However, all of the values could have opposite polarities if the appropriate transistors were utilized.

The charging cycle of control node 14 occurs over a period time $t_1$ through $t_3$ determined by the R-C constant of the charging means. During this time, control node 14 charges from the first value (reference potential) through the second value (threshold potential of transistor $Q_8$) to the third value (threshold potential of transistor $Q_6$). When it reaches the third value (at the end of time $t_3$), it returns to the first value and the cycle repeats itself.

The output voltage at node 12 is initially at the different voltage (reference voltage). As long as the control node voltage is less than the second value (between $t_1$ and $t_2$), node 12 charges to and remains at the given voltage. However, as soon as control node 14 reaches the second value ($t_2$), output node 12 is discharged to the different voltage and remains at this voltage until the cycle repeats and the voltage at control node 14 is again less than the second value.

It will be appreciated that the width of the output pulse is determined by the time it takes for the control node 14 to charge to the second value. Thus by varying the R-C time constant or the magnitude of the second value, the pulse width can be controlled.

The operation of the circuit of the present invention is as follows: At the beginning of time $t_1$ control node 14 is at ground potential and transistor $Q_8$ is nonconductive. Output node 10 will be at the given voltage level determined by the magnitude of voltage source $V_{DD}$. However, when driver transistor $Q_8$ is rendered conductive by the voltage level of control node 14 exceeding the threshold voltage of transistor $Q_8$ (second value), output node 10 is grounded ($t_2$). Control node 14 charges ($t_1$ through $t_3$) in accordance with the value of the R-C circuit comprised of resistor $R_1$ and capacitor $C_1$, the time for charging being dependent upon the R-C constant. From $t_2$ through $t_3$ the voltage level of control node 14 is greater than the threshold voltage of driver transistor $Q_8$ (second value), and the output signal will be at the different voltage, i.e., ground. When the voltage at control node 14 reaches a level sufficient to turn transistor $Q_6$ on, (third value) this will cause capacitor $C_1$ and therefore control node 14 to discharge to ground (end of time $t_3$), thus rendering driver transistor $Q_8$ nonconductive and permitting output node 10 to charge. The level to which control node 14 must charge in order to render transistor $Q_6$ conductive (third value) is determined by the threshold voltage of transistor $Q_6$ as well as the threshold voltages of load transistors $Q_1$ and $Q_3$. As capacitor $C_1$ is discharged causing driver transistor $Q_8$ to turn off, transistor $Q_2$ and $Q_4$ are turned on causing nodes 16 and 18 to go to ground. This returns the circuit to its initial condition such that the oscillation cycle can reoccur.

Through the proper choice of the sizes of transistors $Q_7$ and $Q_8$, the pulse width of the signal provided at output node 10 can be made small in comparison to the total oscillation period, i.e., approximately 30 percent. On the other hand, if the sizes of these transistors are chosen such that the threshold voltage of driver transistor $Q_8$ is relatively large, the pulse width of the output signal can be made to be a comparatively large portion of the total oscillation period. Further, the proper choice of sizes for transistors $Q_7$ and $Q_8$ can also produce a square-wave output, if desired.

Integrated circuit fabrication techniques have advanced to the point where a plurality of transistors which demonstrate satisfactory operational stability can be fabricated and interconnected on a single chip. If the circuit of the present invention is fabricated such that the charging means comprises circuit elements which are external to the chip and connected thereto by a single contact pad, the circuit of the present invention will have operational stability comparable to oscillation circuits requiring as many as three external connections. However, if operational stability is not of prime importance, the charging means $R_1$–$C_1$ may also be formed on the chip itself, thus producing an oscillation circuit having no external contact pads whatsoever (except for the $V_{DD}$ pad which is required on the chip in any event). This could be done by fabricating resistor $R_1$ as a device whose gate is tied to its drain and whose source is tied to the capacitor $C_1$. Capacitor $C_1$ could be made by using the thin oxide layer normally used in the fabrication of metal oxide semiconductor field effect transistors as a dielectric. In this case, the oscillator circuit would be wholly contained on a single chip.

While but a single embodiment of the present invention has been here specifically disclosed, it will be apparent that many variations and modifications may be made therein. It is intended to cover these variations and modifications all of which fall within the scope of the invention as defined in the following claims:

I claim:

1. An oscillator circuit comprising an output node, a control node, first means operatively connected to said output node and said control node and responsive to the voltage at said control node such that when the voltage at said control node is at a first value to charge said output node to a given voltage and when the voltage at said control node is at a second value to charge said output node to a different voltage, charging means operatively connected to said control node and effective to charge said control node from said first value through said second value to a third value over a period of time, and second means operatively connected to said control node and effective to return said control node to said first value when it reaches said third value and then permit it to recharge to said third value.

2. The oscillator circuit of claim 1, in which said first means comprises an inverter circuit comprising a transistor, the control electrode of which is connected to said control node.

3. The oscillator circuit of claim 1, in which said first means comprises, connected in series, s resistive means, said output node, and the output circuit of a transistor, the control electrode of said transistor being connected to said control node.

4. The oscillator circuit of claim 1, in which said second means comprises a transistor, the output circuit of which is connected between said control node and a voltage source of said first value and means for operatively connecting the control electrode of said transistor to said control node.

5. In the oscillator circuit of claim 4, additional transistor means the output circuit of which is connected between a voltage source of said first value and the control electrode of said transistor of said second means, the control electrode of said additional transistor means being operatively connected to said output node.

6. The oscillator circuit of claim 1, in which said second means comprises a transistor the output circuit of which is connected between said control node and a voltage source of said first value and a control electrode of which is connected to said control node via a plurality of transistors whose output circuits are in series and whose control electrodes are connected to one of their output electrodes respectively.

7. In the oscillator circuit of claim 6, additional transistors the output circuits of which are connected between a voltage source of said first value and the output circuits of said series-connected transistors respectively and the control electrodes of which are connected to said output node.

8. The oscillator circuit of claim 3, in which said second means comprises a transistor, the output circuit of which is connected between said control node and a voltage source of said first value and means for operatively connecting the control electrode of, said transistor of said second means to said control node.

9. In the oscillator circuit of claim 8, additional transistor means the output circuit of which is connected between a voltage source of said first value and the control electrode of said transistor of said second means, the control electrode of said additional transistor means being operatively connected to said output node.

10. The oscillator circuit of claim 3, in which said second means comprises a transistor the output circuit of which is connected between said control node and a voltage source of said first value and a control electrode of which is connected to said control node via a plurality of transistors whose output circuits are in series and whose control electrodes are connected to one of their output electrodes respectively.

11. In the oscillator circuit of claim 10, additional transistors the output circuits of which are connected between a voltage source of said first value and the output circuits of said series-connected transistors respectively and the control electrodes of which are connected to said output node.

12. The oscillator circuit of claim 1, in which said output node, said control node, said first means and said second means are fabricated as an integrated circuit on a single substrate.

13. The oscillator circuit of claim 12, in which said first means comprises, connected in series, a resistive means, said output node, and the output circuit of a transistor, the control electrode of said transistor being connected to said control node.

14. The oscillator circuit of claim 12, in which said second means comprises a transistor, the output circuit of which is connected between said control node and a voltage source of said first value and means for operatively connecting the control electrode of said transistor to said control node.

15. In the oscillator circuit of claim 14, additional transistor means the output circuit of which is connected between a voltage source of said first value and the control electrode of said transistor of said second means, the control electrode of said additional transistor means being operatively connected to said output node.

16. The oscillator circuit of claim 12, in which said second means comprises a transistor the output circuit of which is connected between said control node and a voltage source of said first value and a control electrode of which is connected to said control node via a plurality of transistors whose output circuits are in series and whose control electrodes are connected to one of their output electrodes respectively.

17. In the oscillator circuit of claim 16, additional transistors the output circuits of which are connected between a voltage source of said first value and the output circuits of said series-connected transistors respectively and the control electrodes of which are connected to said output node.

18. The oscillator circuit of claim 1, in which said charging means comprises a resistor and a capacitor, and in which said output node, said control node, said first means, said second means, said resistor and said capacitor are all fabricated as an integrated circuit on a single substrate.

19. The oscillator circuit of claim 2, in which said second means comprises a transistor, the output circuit of which is connected between said control node and a voltage source of said first value and means for operatively connecting the control electrode of said transistor of said second means to said control node.

20. The oscillator circuit of claim 18, in which said second means comprises a transistor, the output circuit of which is connected between said control node and a voltage source of said first value and means for operatively connecting the control electrode of said transistor to said control node.

21. In the oscillator circuit of claim 20, additional transistor means the output circuit of which is connected between a voltage source of said first value and the control electrode of said transistor of said second means, the control electrode of said additional transistor means being operatively connected to said output node.

22. The oscillator circuit of claim 18, in which said second means comprises a transistor the output circuit of which is connected between said control node and a voltage source of said first value and a control electrode of which is connected to said control node via a plurality of transistors whose output circuits are in series and whose control electrodes are connected to one of their output electrodes respectively.

23. In the oscillator circuit of claim 22, additional transistors the output circuits of which are connected between a voltage source of said first value and the output circuits of said series-connected transistors respectively and the control electrodes of which are connected to said output node.

24. An oscillator circuit comprising an output node, a control node, first means operatively connected to said output node and said control node and responsive to the voltage at said control node such that when the voltage at said control node is at a first value to charge said output node to a given voltage and when the voltage at said control node is at a second value to charge said output node to a different voltage, charging means operatively connected to said control node and effective to charge said control node from said first value through said second value to a third value over a period of time, and second means operatively connected to said control node and effective, when said control node reaches said third value, to return said control node to said first value during a time interval substantially shorter than the time required to charge said control node to said third value and then permit it to recharge to said third value.

* * * * *